(12) United States Patent
Yang et al.

(10) Patent No.: US 12,131,938 B2
(45) Date of Patent: Oct. 29, 2024

(54) AUTOMATIC WAFER CARRYING SYSTEM AND METHOD FOR TRANSFERRING WAFER USING THE SYSTEM

(71) Applicant: Piotech Inc., Shenyang (CN)

(72) Inventors: Hualong Yang, Shenyang (CN); Dezan Yang, Shenyang (CN); Wenmin Liu, Shenyang (CN); Fengli Wu, Shenyang (CN)

(73) Assignee: Piotech Inc., Shenyang (CN)

( * ) Notice: Subject to any disclaimer, the term of this patent is extended or adjusted under 35 U.S.C. 154(b) by 679 days.

(21) Appl. No.: 17/354,034

(22) Filed: Jun. 22, 2021

(65) Prior Publication Data

US 2021/0407843 A1    Dec. 30, 2021

(30) Foreign Application Priority Data

Jun. 24, 2020    (CN) .......................... 202010593931.2

(51) Int. Cl.
     *H01L 21/68*      (2006.01)
     *H01L 21/677*      (2006.01)
     (Continued)

(52) U.S. Cl.
     CPC .... *H01L 21/6838* (2013.01); *H01L 21/67709* (2013.01); *H01L 21/68764* (2013.01)

(58) Field of Classification Search
     CPC ........... H01L 21/6838; H01L 21/67709; H01L 21/68764; H01L 21/6719; H01L 21/67742;
(Continued)

(56) References Cited

U.S. PATENT DOCUMENTS 9,922,819 B2    3/2018    Balasubramanian et al.
10,710,819 B1 *   7/2020    Thanu ............... H01L 21/68707
(Continued)

FOREIGN PATENT DOCUMENTS

CN      103208447 A   *   7/2013      ............. B25J 18/04
CN      104213086 A   *   12/2014      ............. H01L 21/67
(Continued)

*Primary Examiner* — Mohammed Shamsuzzaman
(74) *Attorney, Agent, or Firm* — Blank Rome LLP

(57) ABSTRACT

An automatic wafer carrying system and a method for transferring a wafer using the system are provided. The system includes: a vacuum chamber, including a plurality of wafer carrying stations; a plurality of first paddles and second paddles, all located inside the vacuum chamber and capable of rotating synchronously separately, where each of the plurality of second paddles and a corresponding first paddle form a pair of paddles to carry a wafer jointly; a double-ferrule magnetofluid, connected to the vacuum chamber in a sealed manner, and connected to the plurality of first paddles and the plurality of second paddles, to drive the first paddles or the second paddles or both the first and second paddles to rotate; a first drive mechanism, connected to the double-ferrule magnetofluid, to drive the plurality of first paddles and the plurality of second paddles through the double-ferrule magnetofluid to rotate synchronously in the same direction; and a second drive mechanism, also connected to the double-ferrule magnetofluid, to implement relative rotation of the plurality of first paddles and the plurality of second paddles through the double-ferrule magnetofluid. The system can reduce movement steps of a wafer during transfer, so as to improve transfer accuracy and stability of the wafer and reduce a position error of the wafer.

18 Claims, 7 Drawing Sheets

(51) Int. Cl.
*H01L 21/683* (2006.01)
*H01L 21/687* (2006.01)

(58) Field of Classification Search
CPC ......... H01L 21/68771; H01L 21/68792; H01L 21/68707; H01L 21/67739; H01L 21/687
See application file for complete search history.

(56) References Cited

U.S. PATENT DOCUMENTS

| | | | | |
|---|---|---|---|---|
| 11,574,826 | B2 * | 2/2023 | Schaller | H01L 21/68771 |
| 2003/0202865 | A1 * | 10/2003 | Ponnekanti | H01L 21/67766 414/217 |
| 2004/0053184 | A1 * | 3/2004 | Bachrach | H01L 21/67742 432/121 |
| 2010/0068014 | A1 * | 3/2010 | Mitsuyoshi | H01L 21/68707 414/226.04 |
| 2010/0178146 | A1 * | 7/2010 | Kremerman | B25J 18/00 74/490.06 |
| 2012/0288347 | A1 * | 11/2012 | Minami | H01L 21/67742 414/217 |
| 2013/0115028 | A1 * | 5/2013 | Kremerman | H01L 21/67742 414/217 |
| 2016/0136818 | A1 * | 5/2016 | Kitahara | H01L 21/68707 901/17 |
| 2016/0155658 | A1 * | 6/2016 | Yang | H01L 21/68707 294/213 |
| 2020/0384636 | A1 * | 12/2020 | Muthukamatchy | B25J 9/1653 |
| 2020/0399077 | A1 * | 12/2020 | Thanu | H01L 21/67184 |
| 2021/0013067 | A1 * | 1/2021 | Carlson | H01L 21/67196 |
| 2021/0013084 | A1 * | 1/2021 | Schaller | H01L 21/67196 |
| 2021/0035838 | A1 * | 2/2021 | Umise | H01L 21/67184 |
| 2021/0320017 | A1 * | 10/2021 | Pathak | H01L 21/6719 |
| 2022/0020615 | A1 * | 1/2022 | Pathak | H01J 37/32899 |
| 2022/0230896 | A1 * | 7/2022 | Mori | C23C 16/4584 |
| 2024/0145278 | A1 * | 5/2024 | Mori | H01L 21/67259 |

FOREIGN PATENT DOCUMENTS

| | | | | | |
|---|---|---|---|---|---|
| CN | 104802162 | A | * | 7/2015 | B25J 18/04 |
| CN | 105448767 | A | * | 3/2016 | H01L 21/67 |
| CN | 106926246 | B | * | 5/2019 | H01L 21/67 |
| CN | 111373522 | A | * | 7/2020 | B25J 11/0095 |
| TW | 201308505 | A | * | 2/2013 | B25J 11/0095 |
| TW | 201314828 | A | * | 4/2013 | B25J 9/042 |
| TW | 201326012 | A | * | 7/2013 | B25J 9/043 |
| TW | 201436962 | A | * | 10/2014 | B25J 11/0095 |
| TW | 201543605 | A | * | 11/2015 | B25J 11/0095 |
| WO | WO-2019021832 | A1 | * | 1/2019 | B25J 15/0273 |

* cited by examiner

AUTOMATIC WAFER CARRYING SYSTEM AND METHOD FOR TRANSFERRING WAFER USING THE SYSTEM

CROSS-REFERENCE TO RELATED APPLICATION(S)

This application claims priority to Chinese Patent Application No. 202010593931.2 filed on 24 Jun. 2020, and all the benefits accruing therefrom under 35 U.S.C. § 119, the contents of which in its entirety are herein incorporated by reference.

BACKGROUND OF THE INVENTION

1. Field of the Invention

The present invention relates to the field of semiconductor wafer processing, and in particular, to a system and method for carrying and transferring a wafer used in a semiconductor processing chamber.

2. Description of the Related Art

A wafer is a base used for preparing a semiconductor apparatus. To prepare the semiconductor apparatus (for example, an integrated circuit or a semiconductor light-emitting apparatus), the wafer needs to be placed in a semiconductor treatment chamber for heating and deposition treatment (for example, chemical vapor deposition (CVD) or plasma-enhanced chemical vapor deposition (PECVD)). In this process, a plurality of wafers need to be disposed at different stations (heating plates) successively. Therefore, a dedicated wafer carrying apparatus is required to place wafers on heating plates one by one and transfer the wafers to different stations.

In the prior art, wafer carrying apparatuses configured to carry and transfer wafers generally have some disadvantages. For example, some carrying apparatuses cause wafers to undergo a relatively large number of movement processes during transfer. Therefore, position errors of the wafers are large, or even an alarm is raised during transfer. In another example, a final position of a wafer at a heating plate also cannot be determined, causing relatively low quality of wafer thin film deposition. In addition, as a result, wafer deposition may be not reproducible.

Therefore, it is necessary to improve the wafer carrying apparatuses in the prior art.

SUMMARY OF THE INVENTION

An objective of the present application is to resolve at least one of problems in the prior art, to provide an automatic wafer carrying system and a method for transferring a wafer using the system. The system and method can achieve at least one of the following objectives:

(1) reducing movement steps of a wafer during transfer, so as to improve transfer accuracy of the wafer and reduce a position error of the wafer;

(2) determining a position of the wafer at a heating plate conveniently and accurately, and improving stability of automatic wafer transfer; and (3) improving uniformity of thin film deposition during a process.

An automatic wafer carrying system is provided in an embodiment of the present application, including: a vacuum chamber, including a plurality of wafer carrying stations; a plurality of first paddles, located inside the vacuum chamber and capable of rotating synchronously; a plurality of second paddles, also located inside the vacuum chamber and capable of rotating synchronously, where each of the plurality of second paddles and a corresponding one of the plurality of first paddles form a pair of paddles to carry a wafer jointly; a double-ferrule magnetofluid, connected to the vacuum chamber in a sealed manner, and connected to the plurality of first paddles and the plurality of second paddles, to drive the first paddles or the second paddles or both the first and second paddles to rotate; a first drive mechanism, connected to the double-ferrule magnetofluid, to drive the plurality of first paddles and the plurality of second paddles through the double-ferrule magnetofluid to rotate synchronously in the same direction; and a second drive mechanism, also connected to the double-ferrule magnetofluid, to implement relative rotation of the plurality of first paddles and the plurality of second paddles through the double-ferrule magnetofluid.

In the foregoing embodiment, the double-ferrule magnetofluid includes a first ferrule, a second ferrule, and a third ferrule rotatable with respect to each other, the second ferrule is connected to the plurality of first paddles, and the third ferrule is connected to the plurality of second paddles.

Preferably, the second ferrule includes a gear, and the first drive mechanism includes a synchronous belt meshed with the gear, to transfer power to the gear of the second ferrule through the synchronous belt to drive the second ferrule to rotate.

Preferably, the first drive mechanism further includes another gear meshed with the synchronous belt, and the another gear is driven by a motor to rotate.

In the foregoing embodiment, the first drive mechanism further includes: a reducer located between the another gear and the motor; and a fixing plate, configured to fix the reducer, and disposed between the reducer and the another gear.

Preferably, the second drive mechanism is a cylinder drive system, and certainly, may be alternatively a hydraulic or another drive system.

In an embodiment, the second drive mechanism includes a first connecting rod fixedly connected to the second ferrule, a second connecting rod fixedly connected to the third ferrule, and a cylinder component hinged between the first connecting rod and the second connecting rod.

Preferably, the cylinder component includes a cylinder barrel and a piston rod, one end of the piston rod is disposed inside the cylinder barrel, the other end of the piston rod is hinged to the first connecting rod, and the cylinder barrel is hinged to the second connecting rod.

Preferably, the second drive mechanism further includes a compressed air swivel joint fixed to the second connecting rod, the compressed air swivel joint includes a plurality of air inlet ports and a plurality of air outlet ports, and the plurality of air outlet ports are connected to the cylinder barrel to provide compressed air to the cylinder barrel. For example, a specific connection manner may be a hose connection.

In the foregoing embodiment, the first ferrule is formed with a flange to be fixed on a bottom wall of the vacuum chamber by a fastener mounted on the flange.

In the foregoing embodiment, preferably, there are a total of six wafer carrying stations (that is, heating plates) inside the vacuum chamber, and correspondingly, there are a total of six first paddles and six second paddles. Certainly, four, eight, ten or another quantity of wafer carrying stations may be alternatively disposed inside the vacuum chamber, and in this case, there are four, eight, ten or another quantity of first paddles and four, eight, ten or another quantity of second paddles correspondingly.

In the foregoing embodiment, preferably, the plurality of first paddles are integrally formed and form rod bodies extending radially outward from a common first central part; and the plurality of second paddles are integrally formed and form rod bodies extending radially outward from a common second central part. Certainly, the plurality of first paddles (and the plurality of second paddles) are not necessarily integrally formed, or may be connected in other manners. For example, the first paddles are welded together.

In the foregoing embodiment, the first central part and the second central part are coaxial but located at different heights; and parts, used for carrying wafers, of the plurality of first paddles and the plurality of second paddles are slightly in a circular arc shape and located at the same height. That is, the plurality of first paddles or the plurality of second paddles vary in a height difference from center positions to parts (that is, free ends thereof) carrying wafers of the plurality of first paddles or the plurality of second paddles.

In the foregoing embodiment, the pair of paddles (a first paddle and a corresponding second paddle) may be operable to jointly lift a wafer in a retracted state, or may be operable to jointly clamp a wafer in a retracted state. A specific manner is determined according to a size of the wafer and a gap between the first paddle and the second paddle.

According to another embodiment of the present application, a method for transferring a wafer using the automatic wafer carrying system is provided.

According to still another embodiment of the present application, another automatic wafer carrying system is provided, including: a vacuum chamber, including a plurality of wafer carrying stations; a plurality of first paddles, located inside the vacuum chamber and capable of rotating synchronously; a plurality of second paddles, also located inside the vacuum chamber and capable of rotating synchronously, where each of the plurality of second paddles and a corresponding one of the plurality of first paddles form a pair of paddles to carry a wafer jointly; a double-ferrule magnetofluid, connected to the vacuum chamber in a sealed manner, and connected to the plurality of first paddles and the plurality of second paddles, to drive the first paddles or the second paddles or both the first and second paddles to rotate; and a first drive mechanism and a second drive mechanism, both connected to the double-ferrule magnetofluid, to collaborate with each other to drive the plurality of first paddles and the plurality of second paddles to rotate synchronously in the same direction and rotate opposite each other.

Similarly, in this embodiment, the pair of paddles (a first paddle and a corresponding second paddle) may be operable to jointly lift a wafer in a retracted state, or may be operable to jointly clamp a wafer in a retracted state. A specific manner is determined according to a size of the wafer and a gap between the first paddle and the second paddle.

In the foregoing embodiment, the first drive mechanism is configured to directly drive the plurality of first paddles to rotate, and simultaneously drive, via the second drive mechanism, the plurality of second paddles to rotate, and in this case, the second drive mechanism does not provide a driving force.

The second drive mechanism is configured to drive the plurality of first paddles to rotate opposite the plurality of second paddles or drive the plurality of second paddles to rotate opposite the plurality of first paddles, and in this case, the first drive mechanism does not provide a driving force.

That is, the first drive mechanism provides a driving force to enable the first paddle and the second paddle to rotate synchronously in the same direction, and the second drive mechanism provides a driving force to enable the first paddle and the second paddle to rotate opposite each other.

According to another embodiment of the present application, a method for transferring a wafer using the automatic wafer carrying system is provided, including:

a) enabling the plurality of first paddles and the plurality of second paddles to be located above the plurality of wafer carrying stations in pairs and in a retracted state to carry wafers;

b) transferring at least one wafer to a position above at least one wafer carrying station inside the vacuum chamber by using a vacuum mechanical arm, and placing the wafer on a pair of first paddle and second paddle;

c) enabling the first drive mechanism to provide a driving force to enable the plurality of first paddles and the plurality of second paddles to rotate synchronously in the same direction, to transfer the wafer to one or more next stations (for example, two or three next stations);

d) repeating step b) and step c) until all the first paddles and the second paddles carry wafers;

e) enabling a strut in the vacuum chamber to rise to lift the wafer to a height greater than the heights of the first paddle and the second paddle to leave from the first paddle and the second paddle;

f) enabling the second drive mechanism to provide a driving force to drive the plurality of first paddles to rotate in a direction away from the plurality of second paddles or drive the plurality of second paddles to rotate in a direction away from the plurality of first paddles, to separate each pair of first paddle and second paddle to an extended state; and g) enabling the strut in the vacuum chamber to lower to place the wafers to corresponding stations in the vacuum chamber, so as to implement overall automatic transfer of wafers in a plurality of stations.

In the foregoing step b), the pair of first paddle and second paddle that are in a retracted state may jointly lift the wafer or jointly clamp the wafer. A specific manner is determined according to a size of the wafer and a gap between the first paddle and the second paddle.

Preferably, in the foregoing method, the double-ferrule magnetofluid includes a first ferrule, a second ferrule, and a third ferrule rotatable with respect to each other, the second ferrule is connected to the plurality of first paddles, and the third ferrule is connected to the plurality of second paddles; and the second ferrule includes a gear, and the first drive mechanism includes a synchronous belt meshed with the gear, another gear meshed with the synchronous belt, a motor driving the another gear, and a reducer located between the another gear and the motor. In step c), the motor generates power and transfers the power to the reducer, the another gear, the synchronous belt, and the gear successively, to enable the second ferrule to rotate.

Preferably, the second drive mechanism includes a first connecting rod fixedly connected to the second ferrule, a second connecting rod fixedly connected to the third ferrule, and a cylinder component hinged between the first connecting rod and the second connecting rod; in step c), the cylinder component does not generate power, and only transfers power from the second ferrule to the third ferrule; and in step 1), the cylinder component generates power to drive the third ferrule to rotate in a direction away from the second ferrule, and the second ferrule remains still, so that the plurality of first paddles and the plurality of second paddles rotate opposite each other and reach an extended state.

The wafer carrying system and the method provided in the present application can bring many superior technical effects in the following:

(1) The first paddle and the second paddle are respectively connected to different ferrules of the double-ferrule magnetofluid, and two sets of driving systems collaborate to drive the first paddle and the second paddle to rotate synchronously in the same direction and rotate opposite each other. Therefore, movement steps of the wafer during transfer are reduced, and accuracy of transfer position and stability of automatic transfer of the wafer are improved.

(2) A pair of first paddle and second paddle are used to clamp or lift a wafer. Therefore, position accuracy of the wafer in a chamber is improved.

(3) The position accuracy and the transfer accuracy of the wafer are improved. Therefore, uniformity of thin film deposition during a process is improved and a product qualification rate is improved.

BRIEF DESCRIPTION OF THE DRAWINGS

Similar to FIG. 2A.

PREFERRED EMBODIMENT OF THE PRESENT INVENTION

The following describes in detail the embodiments of the present application with reference to the accompanying drawings. Various aspects of the present application are easier to be understood by reading the following descriptions of the specific embodiments with reference to the accompanying drawings. It should be noted that, these embodiments are merely examples and used to explain and illustrate the technical solutions of the present application, and are not intended to limit the present application. A person skilled in the art may make various modifications and variations based on these embodiments, and all technical solutions obtained by equivalent transformations shall fall within the protection scope of the present application. The names of various components are used in this specification for illustration purposes only, and do not have a limiting effect. Different manufacturers may use different names to refer to components having the same function.

Figure 1:
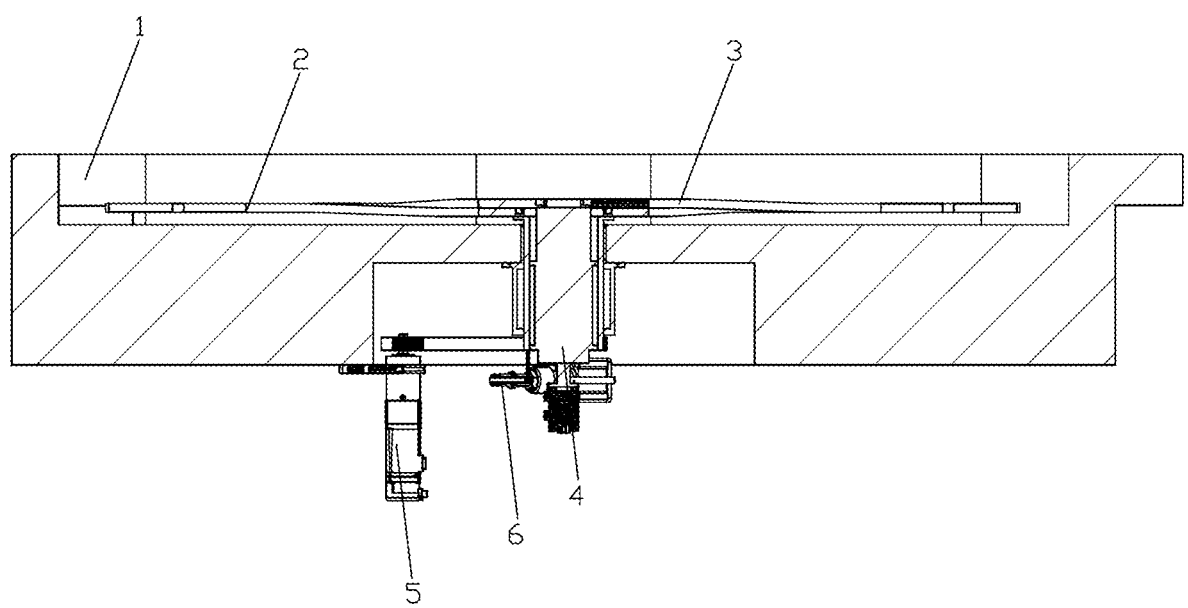
FIG. 1 is a schematic cross-sectional view of an automatic wafer carrying system according to an embodiment of the present application.
Figure 2A:
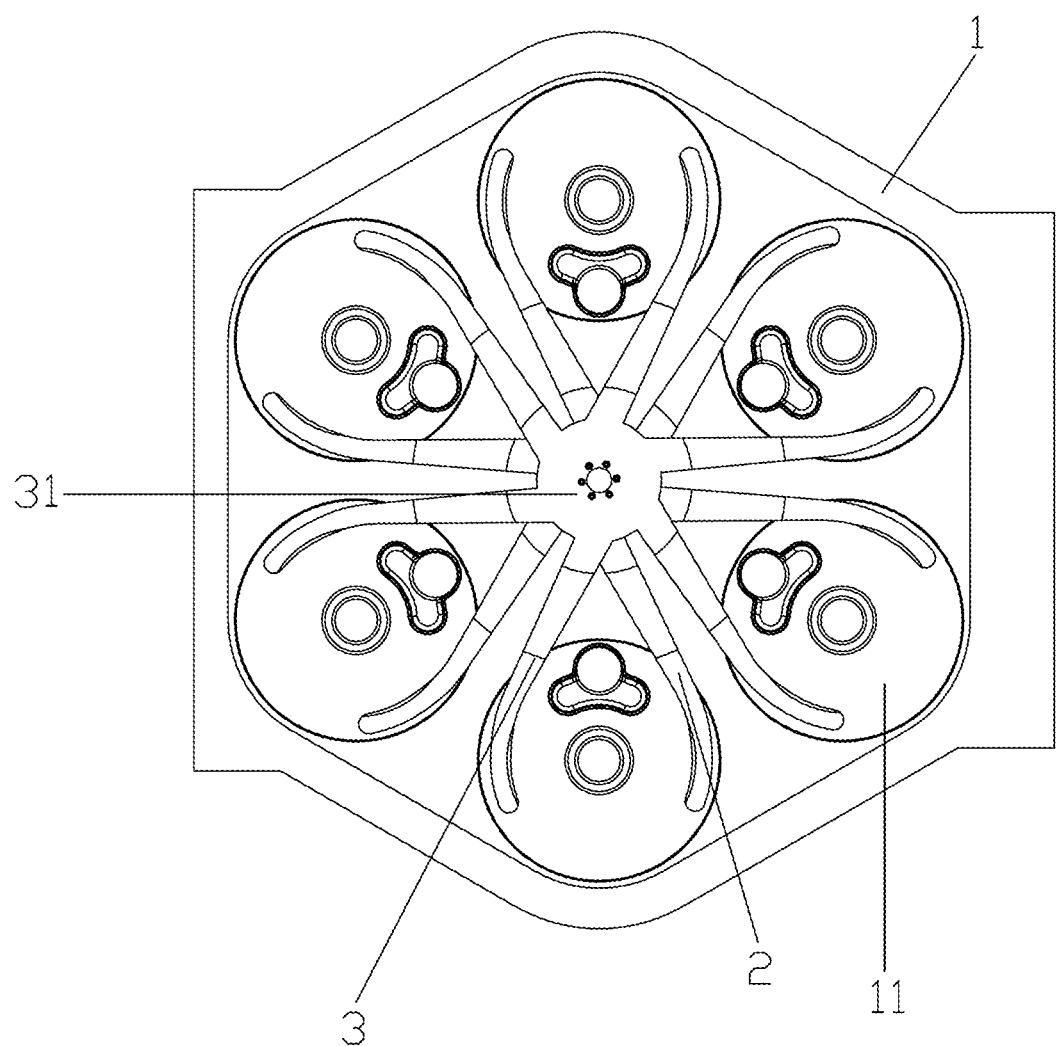
FIG. 2A is a schematic top view of the automatic wafer carrying system shown in FIG. 1, and shows distribution of stations, first paddles, and second paddles in a vacuum chamber of the system, where in this case, the first paddles and the second paddles are in a retracted state and configured to carry wafers.

FIG. 1 is a schematic cross-sectional view of an automatic wafer carrying system according to an embodiment of the present application. FIG. 2A is a schematic top view of the automatic wafer carrying system shown in FIG. 1. As shown in FIG. 1 and FIG. 2A, the automatic wafer carrying system includes a vacuum chamber 1, a plurality of first paddles 2, a plurality of second paddles 3, a double-ferrule magnetofluid 4, a first drive mechanism 5, and a second drive mechanism 6.

The vacuum chamber 1 is also referred to as a reaction chamber, including a plurality of wafer carrying stations (that is, heating plates) 11. The plurality of first paddles 2 are located inside the vacuum chamber 1 and capable of rotating synchronously. The plurality of second paddles 3 are also located inside the vacuum chamber 1 and capable of rotating synchronously. As shown in FIG. 2A, each of the plurality of second paddles 3 and a corresponding one of the plurality of first paddles 2 form a pair of paddles, to form a similar "holding an element with two hands" structure, to carry a wafer jointly. Specifically, the first paddle 2 and second paddle 3 in pairs may be operable to jointly lift a wafer in a retracted state (that is, a state shown in FIG. 2A), or may be operable to jointly clamp a wafer in a retracted state. A specific manner is determined according to a size of the wafer and a gap between the first paddle 2 and the second paddle 3.

In this embodiment of the present application, as shown in FIG. 2A, the vacuum chamber 1 includes a total of six carrying stations 11, and correspondingly, there are a total of six pairs of first paddles 2 and second paddles 3. Certainly, there may be another quantity of stations in the vacuum chamber 1, for example, four, eight, or ten stations. The quantity may be specifically designed as required.

As shown in FIG. 1, the double-ferrule magnetofluid 4 is located at the bottom of the vacuum chamber 1 and is connected to the vacuum chamber in a sealed manner, and connected to the plurality of first paddles 2 and the plurality of second paddles 3, to drive the first paddles or the second paddles or both of the first and second paddles to rotate. Details are provided as follows.

As shown in FIG. 1, the first drive mechanism 5 is connected to the double-ferrule magnetofluid 4, to drive the plurality of first paddles 2 and the plurality of second paddles 3 through the double-ferrule magnetofluid 4 to rotate synchronously in the same direction. The second drive mechanism 6 is also connected to the double-ferrule magnetofluid 4, to implement relative rotation of the plurality of first paddles 2 and the plurality of second paddles 3 through the double-ferrule magnetofluid 4. That is, the first drive mechanism 5 is configured to drive the plurality of first paddles 2 and the plurality of second paddles 3 to rotate synchronously in the same direction, to transfer the wafers on the paddles to one next station (or N next stations, N being an integer greater than 1). However, the second drive mechanism 6 is configured to drive the first paddle 2 and the second paddle 3 to rotate opposite each other (that is, one of the first paddle and the second paddle rotates opposite the other of the first paddle and the second paddle), to enable a gap between the two paddles to increase to an extended state (referring to FIG. 2B. In this case, the wafer may slowly fall to the heating plate (under the support of a supporting rod above the heating plate)), and return to a retracted state (FIG. 2A) subsequently, to carry a next wafer.

The wafer is clamped and supported by using two intersecting paddles in pairs. Therefore, the wafer is positioned more accurately, so as to improve the position accuracy of the wafer. The double-ferrule magnetofluid greatly helps to enable the first paddle and the second paddle to rotate synchronously in the same direction and to rotate opposite each other, and also helps to implement a sealed connection between the double-ferrule magnetofluid and the bottom of the vacuum chamber 1.

Figure 3:
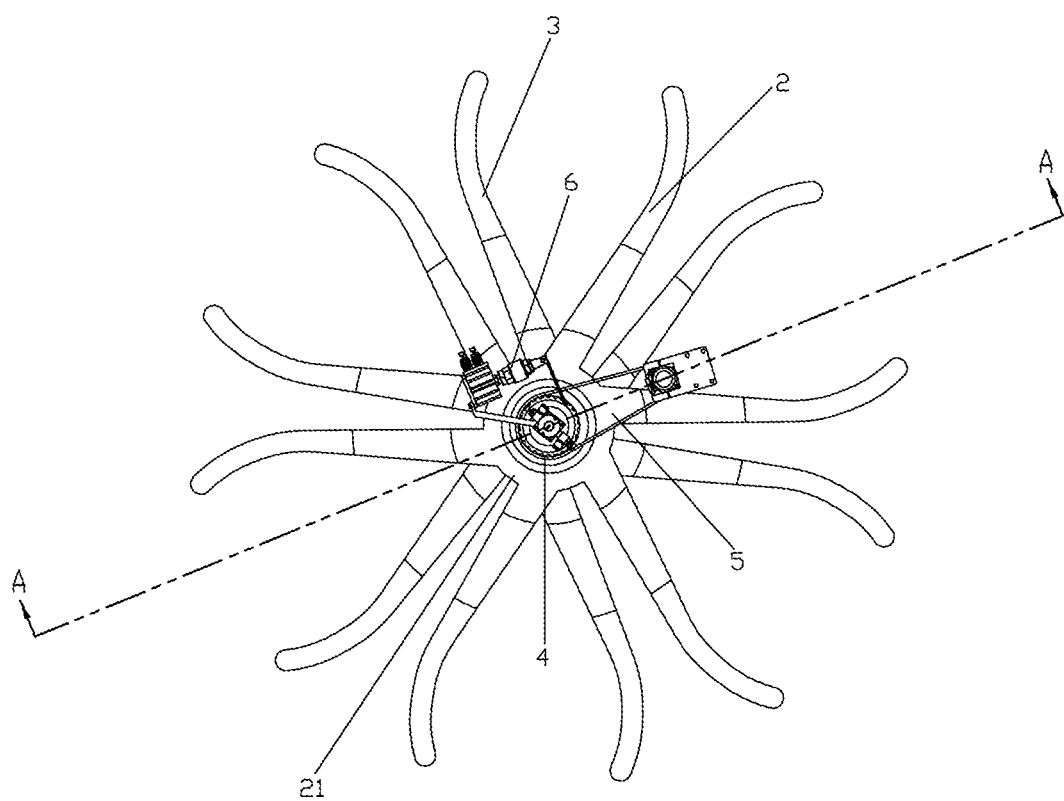
FIG. 3 is a schematic bottom view of the automatic wafer carrying system shown in FIG. 1 with a vacuum chamber omitted, and shows a structure located at the bottom of the vacuum chamber.

FIG. 3 is a schematic bottom view of the automatic wafer carrying system shown in FIG. 1 with a vacuum chamber omitted, and shows a structure located at the bottom of the vacuum chamber. In addition, FIG. 4 is an enlarged cross-sectional view at A-A in FIG. 3, and especially shows a connection relationship between the double-ferrule magnetofluid and the first paddles and the second paddles.

Figure 4:
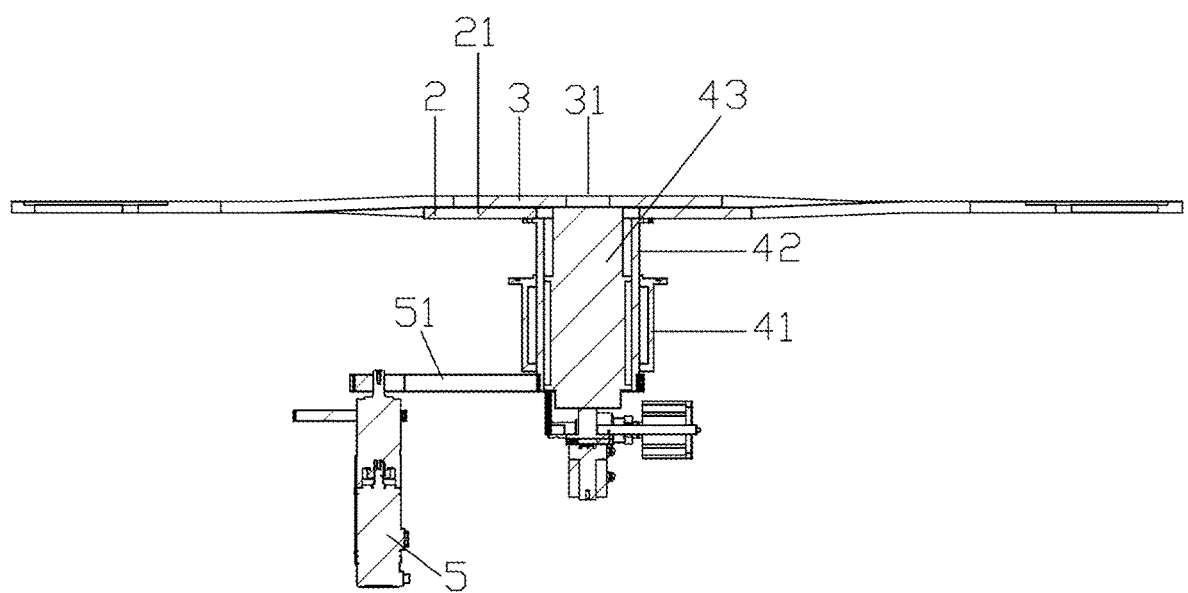
FIG. 4 is an enlarged cross-sectional view (for clarity, the figure is rotated to an orientation similar to that in FIG. 1) at A-A in FIG. 3, and especially shows a connection relationship between the double-ferrule magnetofluid and the first paddles and the second paddles.

As shown in FIG. 4, in the foregoing embodiment of the present application, the double-ferrule magnetofluid 4 includes a first ferrule 41, a second ferrule 42, and a third ferrule 43 rotatable with respect to each other. The first ferrule 41 is located at the outermost part to be fixedly connected to the vacuum chamber 1. The second ferrule 42 is a middle circle, located between the first ferrule 41 and the third ferrule 43, and connected to the plurality of first paddles 2 to enable the plurality of first paddles to rotate. The third ferrule 43 is located on the innermost side and connected to the plurality of second paddles 3, to enable the plurality of second paddles to rotate. A specific connection manner may be a fixed connection, a key connection, or the like.

Figure 5A:
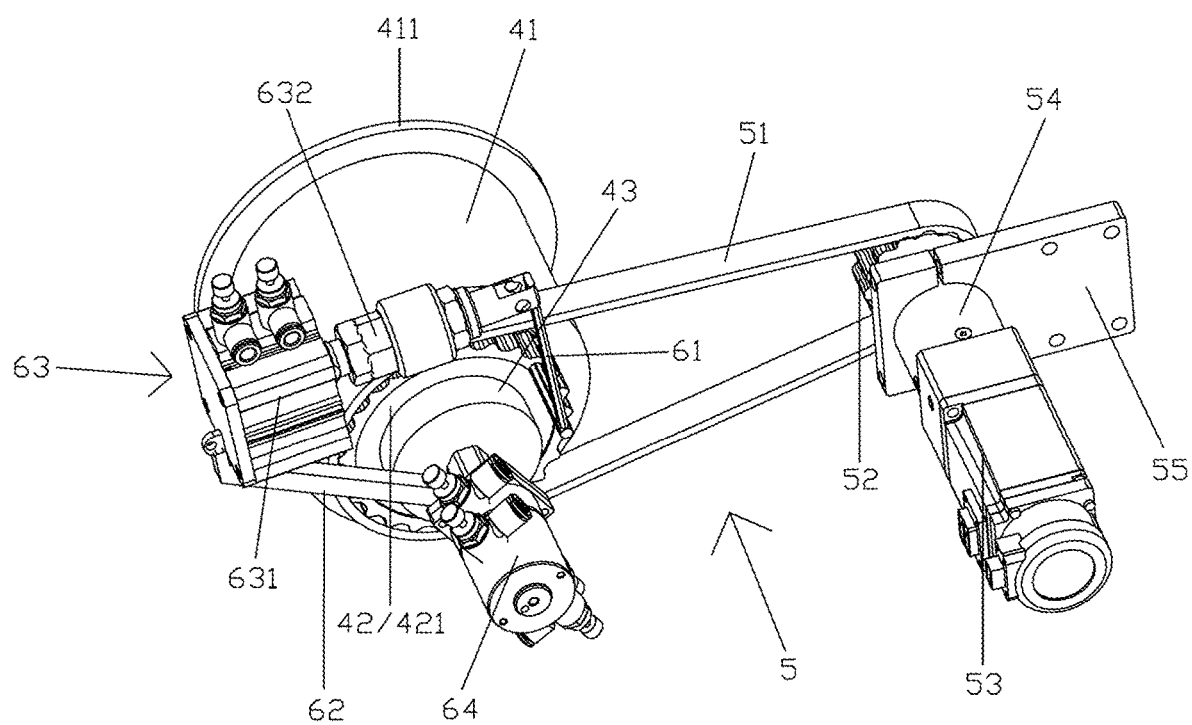
FIG. 5A is a schematic three-dimensional view of the bottom part of the automatic wafer carrying system shown in FIG. 1, and shows a specific structure of and a connection relationship between the double-ferrule magnetofluid and the first drive mechanism and the second drive mechanism, where in this case, a cylinder of the second drive mechanism is in an original state; and Similar to FIG. 5A.

FIG. 5A is a schematic three-dimensional view of the bottom of the automatic wafer carrying system (for clarity, the vacuum chamber, the first paddles, and the second paddles are not shown), and shows a specific structure of and a connection relationship between the double-ferrule magnetofluid 4 and the first drive mechanism 5 and the second drive mechanism 6. In this case, a cylinder of the second drive mechanism is in an original state.

As shown in FIG. 5A, the second ferrule 42 includes a gear 421, and the first drive mechanism 5 includes a synchronous belt 51 meshed with the gear 421, to transfer power to the gear 421 through the synchronous belt to drive the second ferrule 42 to rotate. The synchronous belt 51 is a timing synchronous belt, and provides rotation power to the wafer through the timing synchronous belt to help to improve rotation accuracy and transmission efficiency.

Further, the first drive mechanism 5 further includes: another gear 52, meshed with the synchronous belt 51 and driven by the motor 53 to rotate; a reducer 54, located between the another gear 52 and the motor 53; and a fixing plate 55, disposed between the reducer 54 and the another gear 52, and configured to fix the reducer 54. As shown in FIG. 5A, power (a rotation) generated by the motor 53 is transferred to the another gear 52 through the reducer 54, and the another gear 52 further drives the synchronous belt 51 to move, so that the synchronous belt 51 drives the gear 421 (that is, the second ferrule 42) to rotate. As described above, the second ferrule 42 is connected to the plurality of first paddles 2. Therefore, the first paddles 2 rotate along with the second ferrule 42.

In addition, there is further a connection structure between the second ferrule 42 and the third ferrule 43 to drive the third ferrule 43 to rotate synchronously when the second ferrule 42 rotates. The connection structure between the second ferrule 42 and the third ferrule 43 may be any type of connection structure, provided that the connection structure can implement a rigid connection between the second ferrule and the second ferrule to transfer torque between the second ferrule and the third ferrule.

In an embodiment of the present application, the second drive mechanism 6 is used as the foregoing connection structure. That is, the second drive mechanism 6 is both a drive mechanism configured to implement relative movement between the first paddles 2 and the second paddles 3 and a connection structure configured to implement synchronous movement of the first paddles 2 and the second paddles 3. This special structure design simplifies an overall structure of the transfer apparatus, and is a cost-saving and creative design.

Figure 5B:
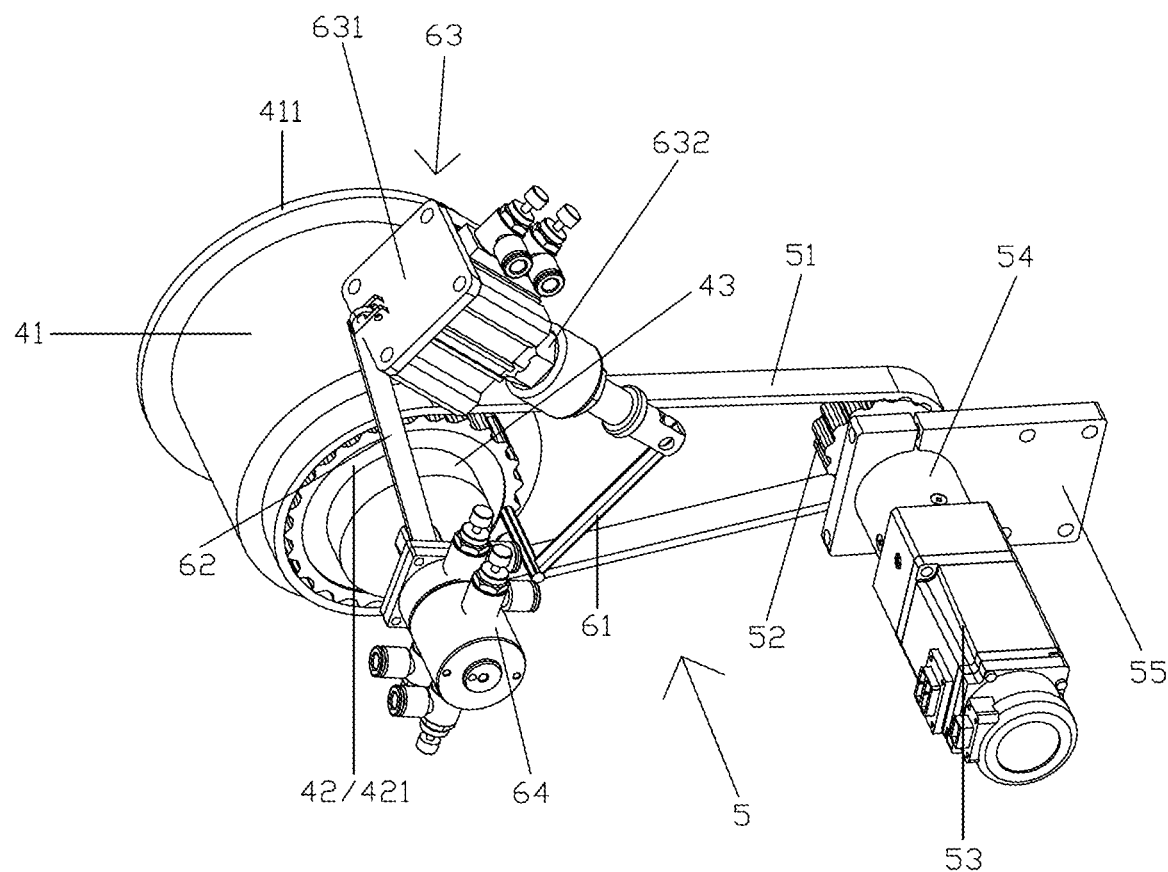
FIG. 5B is also a schematic three-dimensional view of the bottom part of the automatic wafer carrying system, and different from FIG. 5A, the cylinder of the second drive mechanism is in an extended state in this case.

In this embodiment of the present application, the second drive mechanism 6 is a cylinder drive system. Specifically, referring to FIG. 5A and FIG. 5B, the second drive mechanism 6 includes: a first connecting rod 61 fixedly connected to the second ferrule 42, a second connecting rod 62 fixedly connected to the third ferrule 43, and a cylinder component 63 hinged between the first connecting rod 61 and the second connecting rod 62. The cylinder component 63 includes a cylinder barrel 631 and a piston rod 632. As shown in FIG. 5A and FIG. 5B, one end of the piston rod 632 is disposed inside the cylinder barrel 631, the other end of the piston rod is hinged to the first connecting rod 61, and the cylinder barrel 631 is hinged to the second connecting rod 62.

Therefore, when the second ferrule 42 rotates, the first connecting rod 61 is driven to rotate together, and the first connecting rod 61 further drives the cylinder component 63 (an overall structure of the component is equivalent to a connecting rod in this case) and the second connecting rod 62, so as to drive the third ferrule 43 to rotate. That is, the third ferrule 43 and the second ferrule 42 rotate synchronously. Therefore, the third ferrule 43 and the second ferrule 42 respectively drive the first paddle 2 and the second paddle 3 to rotate synchronously. Through the rotation, a wafer may be transferred to one next station (or two or three next stations).

In the foregoing embodiment, as shown in FIG. 5B, the second drive mechanism 6 further includes a compressed air swivel joint 64 fixed to the second connecting rod 62. As shown in the figure, the compressed air swivel joint 64 includes a plurality of air inlet ports and a plurality of air outlet ports. The plurality of air outlet ports may be connected to the cylinder barrel 631 by a hose (not shown in the figure) to provide compressed air to the cylinder barrel.

Figure 2B:
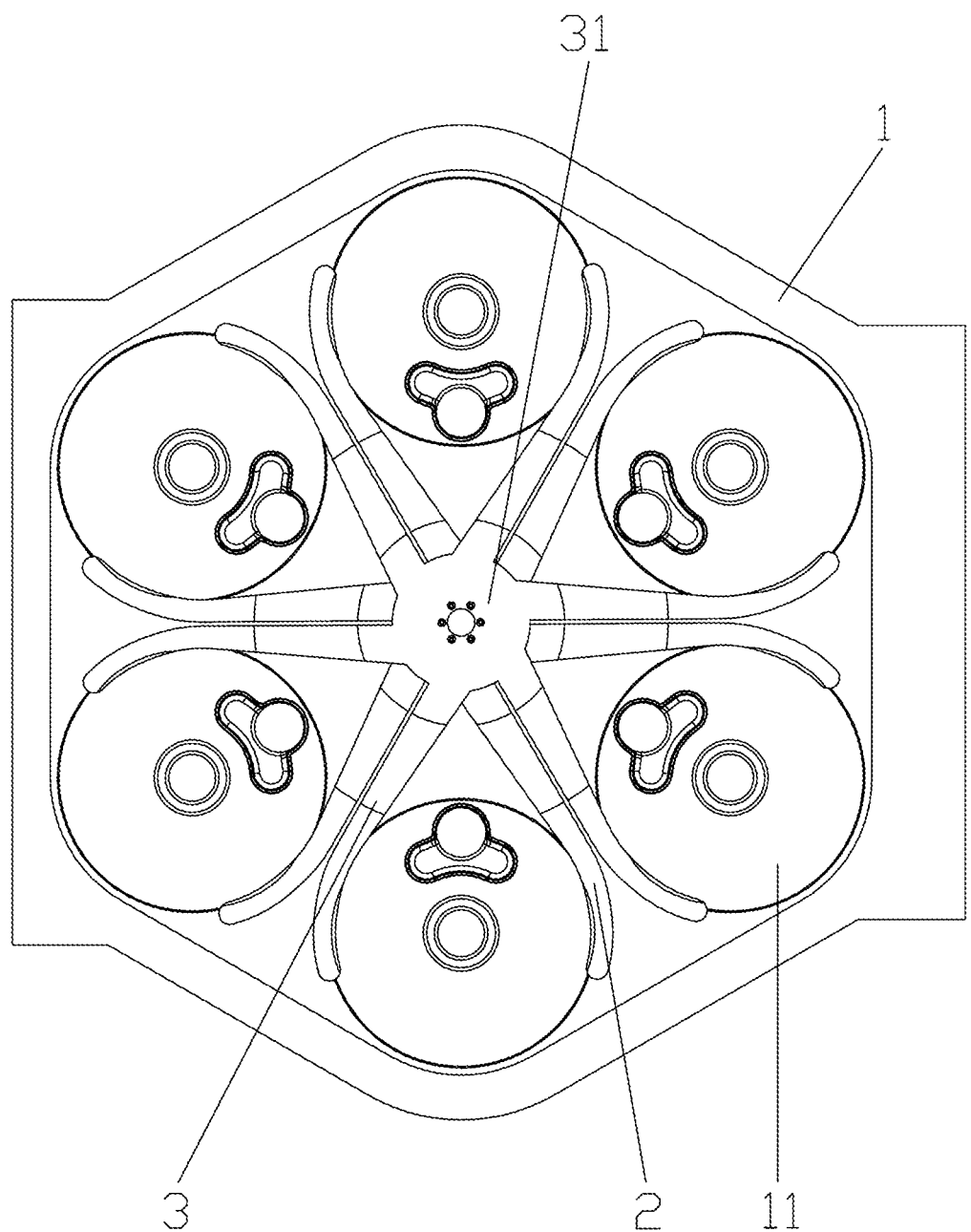
FIG. 2B is also a schematic top view of the automatic wafer carrying system shown in FIG. 1, and different from FIG. 2A, the first paddles and the second paddles are in an extended state in this case.

When compressed air is not injected into the cylinder barrel 631, as shown in FIG. 5A, the cylinder component 63 is in an original state (that is, the piston rod 632 is in a retracted state). When compressed air is injected into the cylinder barrel 631, the compressed air pushes a piston in the cylinder barrel 631 to move outward. That is, the piston rod 632 is pushed to move toward a right end in FIG. 5A and FIG. 5B, until a state shown in FIG. 5B is reached. In this process, the second ferrule 42 remains still. Therefore, the first paddles 2 also remain still, but the piston rod 632 drives the third ferrule 43 through the first connecting rod 61 to rotate. The third ferrule 43 drives the second paddles 3 to rotate in a direction away from the second paddles 2, so that a distance between each pair of first paddle 2 and second paddle 3 is increased so that they are in an extended state (as shown in FIG. 2B). In this case, a wafer may fall from a gap between the first paddle 2 and the second paddle 3.

As can be seen, in the foregoing embodiment of the present application, the first drive mechanism 5 and the second drive mechanism 6 are respectively connected to the second ferrule 42 and the third ferrule 43 of the double-ferrule magnetofluid 4, to collaborate with each other to drive the plurality of first paddles 2 and the plurality of second paddles 3 to rotate synchronously in the same direction and rotate opposite each other. Specifically, the first drive mechanism 5 is configured to directly drive the plurality of first paddles 2 to rotate, and simultaneously drive, via the second drive mechanism 6, the plurality of second paddles 3 to rotate, and in this case, the second drive mechanism 6 does not provide a driving force. The second drive mechanism 6 is configured to drive the plurality of first paddles 2 to rotate opposite the plurality of second paddles 3 or drive the plurality of second paddles 3 to rotate opposite the plurality of first paddles 2, and in this case, the first drive mechanism 5 does not provide a driving force.

As shown in FIG. 5A and FIG. 5B, the first ferrule 41 is formed with a flange 411 to be fixed on a bottom wall of the vacuum chamber 1 by a fastener (for example, a screw and a bolt) mounted on the flange 411.

Returning to FIG. 2A, FIG. 2B, and FIG. 3, in this embodiment of the present application, the plurality of first paddles 2 are integrally formed and form rod bodies extending radially outward from a common first central part 21; and the plurality of second paddles 3 are integrally formed and form rod bodies extending radially outward from a common second central part 31. The first central part 21 and the second central part 31 are coaxial but located at different heights. That is, the plurality of first paddles 2 and the plurality of second paddles 3 all form radial structures. Central parts of the paddles coincide, and free ends, extending outward, of the paddles, that is, parts, used for carrying wafers, of the first paddles 2 and the second paddles 3 are slightly in a circular arc shape and located at the same height, which may be seen clearly from FIG. 1, so as to accurately carry wafers.

The present application further provides a method for transferring a wafer using the automatic wafer carrying system. The method includes the following steps:

a) enabling the plurality of first paddles 2 and the plurality of second paddles 3 to be located above the plurality of wafer carrying stations 11 in pairs and in a retracted state (as shown in FIG. 2A) to carry wafers;

b) transferring at least one wafer to a position above at least one wafer carrying station 11 inside the vacuum chamber 1 by using a vacuum mechanical arm, and placing the wafer on a pair of first paddle 2 and second paddle 3;

c) enabling the first drive mechanism 5 to provide a driving force to enable the plurality of first paddles 2 and the plurality of second paddles 3 to rotate synchronously in the same direction, to transfer the wafer to one or more next stations;

d) repeating step b) and step c) until all the first paddles 2 and the second paddles 3 carry wafers;

e) enabling a strut in the vacuum chamber 1 to rise to lift the wafer to a height greater than the heights of the first paddle 2 and the second paddle 3 to leave from the first paddle and the second paddle;

f) enabling the second drive mechanism 6 to provide a driving force to drive the plurality of first paddles 2 to rotate in a direction away from the plurality of second paddles 3 or drive the plurality of second paddles to rotate in a direction away from the plurality of first paddles, to separate each pair of first paddle 2 and second paddle 3 to an extended state (as shown in FIG. 2B); and g) enabling the strut in the vacuum chamber 1 to lower to place the wafers to corresponding stations in the vacuum chamber 1, so as to implement overall automatic transfer of wafers in a plurality of stations.

As described above, the double-ferrule magnetofluid 4 includes a first ferrule 41, a second ferrule 42, and a third ferrule 43 rotatable with respect to each other, the second ferrule 42 is connected to the plurality of first paddles 2, the third ferrule 43 is connected to the plurality of second paddles 3, and the second ferrule 42 includes a gear 421. The first drive mechanism 5 includes a synchronous belt 51 meshed with the gear 421, another gear 52 meshed with the synchronous belt 51, a motor 53 driving the another gear 52, and a reducer 54 located between the another gear 52 and the motor 53.

In step c), the motor 53 generates power and transfers the power to the reducer 54, the another gear 52, the synchronous belt 51, and the gear 421 successively, to enable the second ferrule 42 to rotate, to drive the first paddle 2 to rotate.

As described above, the second drive mechanism 6 includes a first connecting rod 61 fixedly connected to the second ferrule 42, a second connecting rod 62 fixedly connected to the third ferrule 43, and a cylinder component 63 hinged between the first connecting rod 61 and the second connecting rod 62. In step c), the cylinder component 63 does not generate power, and only transfers power from the second ferrule 42 to the third ferrule (43), to drive the second paddle 3 and the first paddle 2 to rotate synchronously in the same direction. In step 1), the cylinder component 63 generates power to drive the third ferrule 43 to rotate in a direction away from the second ferrule 42, and the second ferrule 42 remains still, so that the plurality of first paddles 2 and the plurality of second paddles 3 rotate opposite each other and reach an extended state.

In the foregoing embodiment, the pair of first paddle 2 and second paddle 3 in a retracted state may jointly lift a wafer or jointly clamp a wafer. A specific manner is determined according to a size of the wafer and a gap between the first paddle 2 and the second paddle 3.

According to the wafer carrying system and method provided in the present application, the first paddle and the second paddle are connected to different ferrules of the double-ferrule magnetofluid, and two sets of driving systems collaborate to drive the first paddle and the second paddle to rotate synchronously in the same direction and to rotate opposite each other. Therefore, movement steps of the wafer during transfer are reduced, and accuracy of transfer position and stability of automatic transfer of the wafer are improved. Moreover, a pair of first paddle and second paddle are used to clamp or support a wafer. Therefore, position accuracy of the wafer in a chamber is improved. In addition, the position accuracy and the transfer accuracy of the wafer are improved. Therefore, uniformity of thin film deposition during a process is improved and a product qualification rate is improved.

Technical content and technical features of the present application are described by the foregoing related embodiments. However, the foregoing embodiments are merely examples for implementing the present application. Persons skilled in the art may still make replacements and modifications based on the teachings and the disclosure of the present application without departing from the spirit of the present application. Therefore, the disclosed embodiments of the present application do not limit the scope of the present application. On the contrary, modifications and equivalent arrangements included in the spirit and scope of the claims are all included in the scope of the present application.

What is claimed is:

1. An automatic wafer carrying system, comprising:
a vacuum chamber, comprising a plurality of wafer carrying stations;
a plurality of first paddles, located inside the vacuum chamber and capable of rotating synchronously;
a plurality of second paddles, also located inside the vacuum chamber and capable of rotating synchronously, wherein each of the plurality of second paddles and a corresponding one of the plurality of first paddles form a pair of paddles to carry a wafer jointly;
a double-ferrule magnetofluid, connected to the vacuum chamber in a sealed manner, and connected to the plurality of first paddles and the plurality of second paddles, to drive the first paddles or the second paddles or both the first and second paddles to rotate;
a first drive mechanism, connected to the double-ferrule magnetofluid, to drive the plurality of first paddles and the plurality of second paddles through the double-ferrule magnetofluid to rotate synchronously in the same direction; and
a second drive mechanism, also connected to the double-ferrule magnetofluid, to implement relative rotation of the plurality of first paddles and the plurality of second paddles through the double-ferrule magnetofluid, wherein:
the double-ferrule magnetofluid comprises a first ferrule, a second ferrule, and a third ferrule rotatable with respect to each other,
the second ferrule is connected to the plurality of first paddles,
the third ferrule is connected to the plurality of second paddles,
the first drive mechanism is configured to directly drive the plurality of first paddles to rotate, and simultaneously drive, via the second drive mechanism, the plurality of second paddles to rotate, and in this case, the second drive mechanism does not provide a driving force; and
the second drive mechanism is configured to drive the plurality of first paddles to rotate opposite the plurality of second paddles or drive the plurality of second paddles to rotate opposite the plurality of first paddles, and in this case, the first drive mechanism does not provide a driving force.

2. The automatic wafer carrying system according to claim 1, wherein the second ferrule comprises a gear, and the first drive mechanism comprises a synchronous belt meshed with the gear.

3. The automatic wafer carrying system according to claim 2, wherein the first drive mechanism further comprises another gear meshed with the synchronous belt, and the another gear is driven by a motor to rotate.

4. The automatic wafer carrying system according to claim 3, wherein the first drive mechanism further comprises a reducer located between the another gear and the motor.

5. The automatic wafer carrying system according to claim 4, wherein the first drive mechanism further comprises a fixing plate configured to fix the reducer, and the fixing plate is disposed between the reducer and the another gear.

6. The automatic wafer carrying system according to claim 1, wherein the second drive mechanism is a cylinder drive system.

7. The automatic wafer carrying system according to claim 6, wherein the second drive mechanism comprises a first connecting rod fixedly connected to the second ferrule, a second connecting rod fixedly connected to the third ferrule, and a cylinder component hinged between the first connecting rod and the second connecting rod.

8. The automatic wafer carrying system according to claim 7, wherein the cylinder component comprises a cylinder barrel and a piston rod, one end of the piston rod is disposed inside the cylinder barrel, the other end of the piston rod is hinged to the first connecting rod, and the cylinder barrel is hinged to the second connecting rod.

9. The automatic wafer carrying system according to claim 8, wherein the second drive mechanism further comprises a compressed air swivel joint fixed to the second connecting rod, the compressed air swivel joint comprises a plurality of air inlet ports and a plurality of air outlet ports, and the plurality of air outlet ports are connected to the cylinder barrel to provide compressed air to the cylinder barrel.

10. The automatic wafer carrying system according to claim 1, wherein the first ferrule is formed with a flange to be fixed on a bottom wall of the vacuum chamber by a fastener mounted on the flange.

11. The automatic wafer carrying system according to claim 1, wherein there are a total of six wafer carrying stations inside the vacuum chamber, and correspondingly, there are a total of six first paddles and six second paddles.

12. The automatic wafer carrying system according to claim 1, wherein the plurality of first paddles are integrally formed and form rod bodies extending radially outward from a common first central part; and the plurality of second paddles are integrally formed and form rod bodies extending radially outward from a common second central part.

13. The automatic wafer carrying system according to claim 12, wherein the first central part and the second central part are coaxial but located at different heights; and parts, used for carrying wafers, of the plurality of first paddles and the plurality of second paddles are slightly in a circular arc shape and located at the same height.

14. The automatic wafer carrying system according to claim 1, wherein the pair of paddles are operable to jointly lift a wafer in a retracted state.

15. The automatic wafer carrying system according to claim 1, wherein the pair of paddles are operable to jointly clamp a wafer in a retracted state.

16. An automatic wafer carrying system, comprising:
a vacuum chamber, comprising a plurality of wafer carrying stations;
a plurality of first paddles, located inside the vacuum chamber and capable of rotating synchronously;
a plurality of second paddles, also located inside the vacuum chamber and capable of rotating synchronously, wherein each of the plurality of second paddles and a corresponding one of the plurality of first paddles form a pair of paddles to carry a wafer jointly;
a double-ferrule magnetofluid, connected to the vacuum chamber in a sealed manner, and connected to the plurality of first paddles and the plurality of second paddles, to drive the first paddles or the second paddles or both the first and second paddles to rotate; and
a first drive mechanism and a second drive mechanism, both connected to the double-ferrule magnetofluid, to collaborate with each other to drive the plurality of first paddles and the plurality of second paddles to rotate synchronously in the same direction and rotate opposite each other, wherein:

the double-ferrule magnetofluid comprises a first ferrule, a second ferrule, and a third ferrule rotatable with respect to each other, the second ferrule is connected to the plurality of first paddles, the third ferrule is connected to the plurality of second paddles, the first drive mechanism is configured to directly drive the plurality of first paddles to rotate, and simultaneously drive, via the second drive mechanism, the plurality of second paddles to rotate, and in this case, the second drive mechanism does not provide a driving force; and the second drive mechanism is configured to drive the plurality of first paddles to rotate opposite the plurality of second paddles or drive the plurality of second paddles to rotate opposite the plurality of first paddles, and in this case, the first drive mechanism does not provide a driving force.

17. The automatic wafer carrying system according to claim 16, wherein the pair of paddles are operable to jointly lift a wafer in a retracted state.

18. The automatic wafer carrying system according to claim 16, wherein the pair of paddles are operable to jointly clamp a wafer in a retracted state.

* * * * *